COMPUTER LOGIC DEVICE CONSISTING OF AN ARRAY OF TUNNELING DIODES, ISOLATORS AND SHORT CIRCUITS

Filed Feb. 1, 1965

INVENTORS
JACK S. CUBERT
JAMES J. MURPHY
BY Thomas J. Moran
ATTORNEY

United States Patent Office 3,423,646
Patented Jan. 21, 1969

3,423,646

COMPUTER LOGIC DEVICE CONSISTING OF AN ARRAY OF TUNNELING DIODES, ISOLATORS AND SHORT CIRCUITS

Jack S. Cubert, Willow Grove, and James J. Murphy, Philadelphia, Pa., assignors to Sperry Rand Corporation, New York, N.Y., a corporation of Delaware Filed Feb. 1, 1965, Ser. No. 429,482
U.S. Cl. 317—234 4 Claims
Int. Cl. H01l 3/00, 5/00

Figure 1:
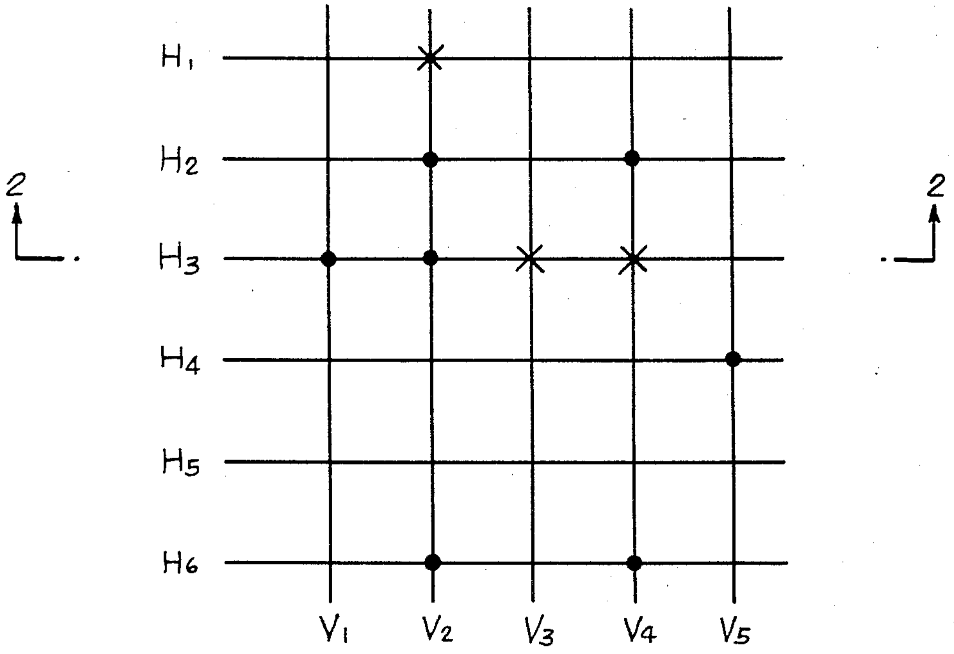

This invention relates to thin film structures. More particularly, this invention relates to thin film structures, such as thin film electrical or electronic components, e.g., thin film tunnel diodes or other thin film devices employing tunneling or other electron transfer mechanism. Still more particularly, this invention relates to an array of such thin film structures or devices, and a method for producing same.

Thin film structures of this invention are capable of improved reliability, increased density of useful devices or components per unit area or space of packaged finished product and of improved flexibility, particularly from the point of view of component interconnection and circuitry.

Thin film structures, such as a thin film tunnel diode or thin film triode, and methods of producing same, are known, and are shown for example in Mead U.S. Patent 3,056,073. That patent discloses solid state electron devices comprising a thin tunneling insulator film, such as an insulator film having a thickness in the range 10–60 A. deposited between two metal films in electrical contact with the insulator film. The disclosures of that patent are herein incorporated and made part of the present specification.

Tin film structures are considered highly advantageous in many applications because of their extreme compaction, their low or potentially low manufacturing costs, and the possibilities of microminiaturization which they have brought to several fields of use. In many applications, such as for example in computer logic applications, it is desirable to group a plurality of passive or active and passive elements on a common structure, and it would accordingly be desirable to fabricate interconnected groups or arrays of such elements into a single structure employing thin film elements having tunneling characteristics.

Techniques are known whereby it is possible to fabricate very many, more than 100, dual input AND gates on a single one inch diameter wafer. The interconnection of individual ones of these gates to other gates on the wafer or components external to the wafer, however, presents a great problem to the designer, the fabricator and the packager. In arrangements known heretofore far greater space is required for the external connection of such devices than is required for the devices themselves. In some devices interconnection is made at the same time as the basic logic circuitry is deposited or fabricated but the remaining connections must be made in a plurality of separate operations once fabrication has been completed.

The practice of this invention permits the deposition of all interconnecting leads between the various logical elements, the fabrication of leads for connection of external circuitry and all logical elements in the same batch. Accordingly, there is produced in accordance with the practice of this invention a device which is far more flexible, much smaller in size and possessing greater reliability.

Accordingly, it is an object of this invention to provide an array of thin film structures or thin film electrical or thin film electronic components, and method of producing same, having improved flexibiilty, substantially reduced size and space requirements, particularly for interconnections, and possessing improved reliability.

It is another object of this invention to provide thin film structures having a plurality of interconnected thin film tunneling elements or other thin film structures exhibiting tunneling or other electron transfer mechanisms.

Another object of this invention is to provide such thin film structures by a highly economical method.

Another object of this invention is to provide a method for preparing such a thin film structure wherein all or substantially all the elements and all or substantially all the interconnections thereof may be fabricated by deposition.

Another object of this invention is to provide a new thin film computer logic structure employing elements having tunneling or other electrical characteristics, e.g., Shockley emission, and a method for producing same.

Figure 2:
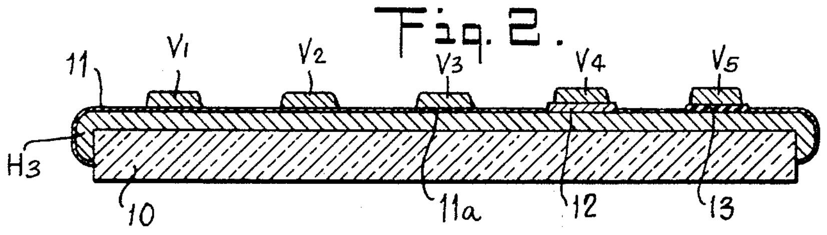
Figure 3:
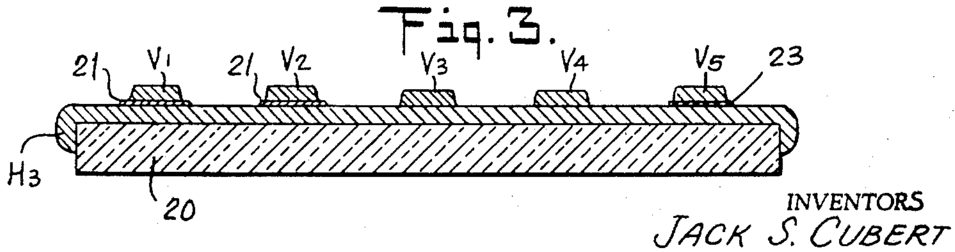

These and further objects of the invention will be more fully understood in the light of the description of an embodiment thereof illustrated in the accompanying drawings, wherein:

FIGURE 1 is a schematic top view layout of an array of conductors arranged according to the invention so as to include diodes, open-circuit junctures, and short-circuit junctures, at various positions defined by the various crossings of the conductors;

FIGURE 2 is one representation, with the detail and proportions thereof exaggerated for clarity, of a cross-sectional view taken of the structure represented schematically in FIGURE 1 along the line 2—2 therein; and FIGURE 3 is another representation, similar to that shown in FIGURE 2 and representing the same cross-section, but showing an alternative structural embodiment for effecting the same schematic circuit elements.

Briefly, in one form the invention contemplates depositing a plurality of first discrete thin film metallic conductors upon an insulating substrate; causing a thin film material overlayer, such as a thin film tunneling material overlayer, along said first conductors of a material selected to form a three layer thin film structure, e.g., a thin film tunneling diode, with underlying and to be formed overlying metallic conductor layers; depositing a thin film insulating material along said first conductors, said thin film material overlayer and said insulating material cooperating to define selected first areas of exposed thin film overlayer material and selected second areas of exposed thin film insulating material; and depositing a plurality of second discrete thin film metallic conductors over said first conductors such that said second conductors cross said first conductors at said first and second selected areas. In another form of the invention it is contemplated that third selected areas will be produced on said first conductors, which third selected areas will present local short-circuit conductive access between said first conductors and said second conductors. In some forms of the invention the aforesaid thin film material forming the middle element of the diodes or the intermediate layers will be deposited from a vapor thereof, while in other forms of the invention the intermediate layers will be formed in situ on the first conductor metal as the oxide thereof.

Referring now to the drawings, in FIGURE 1 is shown a schematic of an array of conductors having certain interconnections at certain of the mutual crossings therebetween. Such an array finds particular use as a computer logic matrix, but the principles of the invention are equally applicable to other forms of circuitry susceptible to advantageous use with thin film elements.

In FIGURE 1 is shown a plurality of first conductors identified as V1, V2, V3, V4 and V5. A second plurality of conductors is identified as H1, H2, H3, H4, H5 and H6. These schematic conductors represent deposited lines of metallic conductor material deposited on and bonded to an underlying plate or chip of insulating material, such as glass, alumina or similar inert, insulating material, used as the structural frame for the array. While the schematic shows the conductors as arranged in two groups, each group being essentially parallel and equally spaced as regards its members, and the groups being mutually perpendicular to each other, this arrangement, while common practice in computer logic arrays, it not necessary to the practice of the invention. Other forms of circuitry may find other orientations, conformations and distributions of substrate and conductors to be advantageous.

In the schematic representation of FIGURE 1, conductors that present an open circuit relative to an underlying conductor while crossing same, have that fact represented by a simple crossing of the lines representing the respective crossing conductors, without more. Such an open circuit is illustrated for example at the crossing point of conductor H3 and conductor V5. Conductors, which at their mutual crossing point, have short-circuit electrical contact therebetween, are represented in FIGURE 1 by a second crossing at their point of crossing. Such a short-circuit connection is shown in FIGURE 1 at the crossing between conductor H3 and each of the conductors V3 and V4. Conductors, which at their mutual crossing are separated by a material forming a thin film diode therewith, are represented in FIGURE 1 by a dot at the point of crossing. For example, conductor H3 is shown forming a diode at the crossing with each of conductors V1 and V2. As will be apparent to those skilled in the art, the number and position of the various diodes, open-circuits, and short-circuits, will be arranged according to the function to be performed by the array. Other elements may also of course be introduced into the array at or connected to the various conductors H1, etc., and V1, etc. Such elements may include resistors, transistors, other elements, or conductor terminals.

In FIGURE 2 is shown a structure for effecting the various crossings shown along conductor H3 in FIGURE 1. That is to say, a first structure for effecting the crossings between H3 and V1, H3 and V2, H3 and V3, H3 and V4, and H3 and V5, is shown in FIGURE 2. A second structure for effecting these same crossings is shown in FIGURE 3. The crossings illustrated in FIGURES 2 and 3 are representative of those employed throughout the example array of FIGURE 1. The structure of FIGURE 2, and the method for producing same, will be described first.

The insulating substrate 10 comprises a plate or chip of suitable inert, insulating substrate material, usually glass or alumina, upon which the thin film circuitry is built. Such chip substrates are frequently less than one square inch in major surface area, i.e., surface area upon which the circuitry is built. The conductor H3 comprises gold, silver, platinum, palladium, aluminum, copper, zinc, chromium, iron, nickel, lead, magnesium, titanium, tantalum, vanadium, cobalt, tungsten, bismuth, or any of the other various electrically conductive metals. The underlying conductors of which H3 is one are often termed the electrodes in this art. The overlying conductors V1, etc., are often termed the counter-electrodes. Both conductors, i.e., the electrodes and the counter-electrodes, are of the order of 1000–2000 Angstrom units thick, more or less.

Atop the conductor H3, and the other conductors from the H group, i.e., the underlying conductor is a thin film 11 of a material selected to exhibit tunneling characteristics or other electron transfer mechanism. Such materials will form a three layer thin film tunneling diode with the underlying and overlying metal conductor layers. While many materials exhibit tunneling in such a three layer arrangement, a preferred material for thin film layer 11 is selected from the class consisting of aluminum oxide, oxide of the material forming the H3 electrode or other metal oxide exhibiting tunneling characteristics. This thin film 11 may be, for example, in the order of 10 to 60 Angstrom units in thickness. A preferred thickness is 10 to 30 Angstrom units. In the in situ oxidized form, described hereinbelow, a preferred thickness is 15 to 20 Angstrom units. The thin film 11, as may be seen in FIGURE 2, covers essentially all of the surface of conductor H3, except a perforated portion 11*a* underlying conductor V3, as hereinafter described.

Cadmium sulfide which is of special interest because of its reported use as insulated-gate transistors may comprise thin film 11. When cadmium sulfide is the material making up a layer, such as thin film layer 11, it is preferred that it be employed at a thickness in the range 1,000–10,000 Angstrom units, preferably in the range 1000–3000 Angstrom units. As a general rule the cadmium sulfide layer should be approximately as thick as the associated conductor or semi-conductor layers used for the source and drain.

The conductors V1, etc. overlie the conductors H3, etc. and form a grid therewith having a plurality of crossing points already described with respect to FIGURE 1. The material of the conductors V1 etc. and H1 etc. may be chosen from any of the conductive metals. The conductors H1 etc. and V1 etc. are both advantageously fabricated to about 1 mil width. By this means, at the perpendicular crossings therebetween, a crossing area of about 1 mil by 1 mil is created. Other conductor widths, smaller or larger, may be employed.

An illustrative diode is formed at the crossing between conductor H3 and the conductor V1, comprising a thin film tunneling material layer 11 interposed at the aforesaid crossing area between conductor H3 and conductor V1. Similarly, another illustrative diode is formed at the crossing between conductor H3 and conductor V2.

An illustrative short-circuit connection is shown between conductor H3 and conductor V3, the structure accomplishing same constituting an interrupted or perforated area 11*a* in the thin film tunneling material 11 at the crossing between conductor H3 and conductor V3, so that contacting access occurs between the metallic surface of conductor H3 and the metallic surface of conductor V3. The method for producing this is described hereinbelow. Another illustrative short-circuit is shown between conductor H3 and conductor V4, the structure accomplishing same in this case, comprising a noble metal, such as gold, silver, platinum, thin film layer 12 of sufficient area to cover the crossing area defined between conductor H3 and conductor V4, the noble metal thin film layer 12 being bonded directly to the conductor H3 and being bonded directly to the conductor V4. The noble metal thin film layer 12 may be for example about 100 to 1000 Angstrom units in thickness, more or less, when the conductor H3 is about 2000 Angstrom units in thickness. A preferred noble metal for layer 12 is gold.

An illustrative open-circuit is shown between conductor H3 and conductor V5, the structure accomplishing same comprising a thin film layer 13 of insulating material, such as silicon monoxide, bonded directly to conductor H3, the insulating material layer 13 being of sufficient area to cover the crossing area between conductor H3 and conductor V5 and sufficiently thick to be electrically insulating. Bonded atop insulating material layer 13 is conductor V5, the interposition of insulating material layer 13 thereby separating conductor H3 from conductor V5 at the crossing area therebetween so as to form the open-circuit. The thickness of the insulating material layer 13 is preferably about 5000 Angstrom units, more or less.

The aforesaid structure shown in FIGURE 2 may be attained employing any of the aforesaid conductor materails, and any of the aforesaid thin film layer 11 materials exhibiting tunneling or other electron transfer mechanisms. However, this structure most advantageously results from a variation of the process according to the invention wherein the thin film layer 11 is formed on the conductor H3 in situ as the oxide thereof, rather than by deposition of thin film layer 11 thereon. When the in situ oxidation variation of the process according to the invention is practiced, the conductors H3 etc. will be deposited upon the insulating substrate 10, and that structure will then be subjected to oxidation as hereinafter set forth, until thin film layer 11 is formed thereon. While any of the aforesaid metallic conductor materials may be employed in this variation of the process, and preferably provided an oxide thereof may be formed thereon, the preferred materials are aluminum, tantalum and titanium. For example, when the conductors H3 etc. are aluminum, the in situ oxidized thin film layer 11 will be aluminum oxide ($Al_2O_3$). The overlying conductors V1 etc. will subsequently be deposited atop the in situ oxidized thin film layer 11, and the resulting structure, without more, would include a diode at each such crossing.

In this in situ oxidation variant of the present process certain steps may be taken before oxidation to produce open-circuits and short-circuits similar to those already described. For example, if noble metal short-circuits (as H3–V4 in FIGURE 2) are to be produced, the noble metal thin film layer 12 will first be deposited upon the conductor H3 before the aforesaid oxidation, at each crossing where a short-circuit is intended. The subsequent oxidation will not affect the noble metal layer 12, and the metallic upper face of layer 12 will be preserved despite oxidation of the conductor H3, so that access to layer 12 and thus to conductor H3 by the overlying conductor V4 may be effected. Similarly, an open-circuit is produced in the in situ oxidized variant of the process, at the intersection of electrode H3 and counter-electrode V5 for example, by depositing a silicon monoxide or other insulating material 13, preferably before the oxidizing step, so that no diode is formed between conductor H3 and conductor V5.

A short-circuit point can also be produced in an array according to the in situ oxidation variant of the process, by steps after the oxidation rather than before. Thus when a perforated area **11*a* is to be produced to form a short circuit, as at H3–V3, the conductor H3 is oxidized to produce thin film 11, the other crossing conductors including V3 are deposited, and then a breakdown voltage is impressed between, for example, conductors H3 and V3, to break down the film 11 at the crossing therebetween causing a short-circuit between conductors H3 and V3, e.g. through breaks 11*a* in film 11**.

A further element, a capacitive point or capacitive crossing can also be produced in an array in acordance with this invention. Indeed, each of the so-called open circuit connections or points is, in fact, a capacitor. Accordingly, capacitors or capacitive crossings having desired and variable capacitive effects may also be produced in an array according to this invention. By fabricating a capacitive crossing wherein the intermediate insulating thin film layer is made of silicon monoxide of approximately 200 Angstrom units thickness with sandwiching metal conductor layers, such as aluminum having a thickness of about 1000 Angstrom units, and retaining a 1 mil crossing, i.e. the conductors being 1 mil wide, a capacitance or a capacitor crossing having a 2.5 micro-micro-farads or 2.5 pico farads rating may be obtained. Generally speaking, approximately 5 pico farads per square mil may be expected when employing a dielectric material having a thickness of 100 Angstrom units, said dielectric material having a dielectric constant of 10. Greater capacitance may be achieved by increasing the size of the crossing. Such an arrangement could be achieved by spacing the vertical conductors V1, etc. near either end of the matrix or substrate a greater distance apart and depositing wider vertical conductors V1, etc. Similar changes may also be made in the horizonal conductors H1, etc. Also, if desired, special selected inter-layer materials sandwiched between the conductors may be employed, particularly selected materials having a high dielectric constant, e.g. ferroelectric materials, such as barium titanate, which may have a dielectric constant of approximately 2000.

As aforesaid, while the structure of FIGURE 2 may also be produced by techniques wherein thin film layer 11 is deposited rather than in situ oxidized, the scheme of the structure lends itself to production of the thin film layer 11 as an oxide of the conductor H3 which is produced in situ thereon. In all cases, the substrate 10 is first thoroughly cleaned by washing in water and/or appropriate organic solvents, e.g. acetone, alcohol or by ion bombardment. The in situ oxidized variant of the inventive process then involves the deposition by any suitable technique of the series of conductors H1 etc., including the illustrated conductor H3, upon the substrate 10. Preferably, this deposition of the conductors H1 etc. is by known vacuum metal deposition techniques, for example by such deposition effected at relatively low pressure, such as in the range of about $1\times10^{-6}$ mm. Hg to about $1\times10^{-4}$ mm. Hg. When refractory metals such as tantalum or titanium are to be deposited, such refractory metals may be vaporized by means of an electron gun or beam.

As aforesaid, in this variant of the process wherein the thin film layer 11, such as a thin film layer exhibiting tunneling or other electron transfer mechanism, is an in situ produced oxide of the conductors H1 etc., the materials of the conductors H1 etc., which may be the same or different, must be oxidizable, and is preferably chosen from among aluminum, titanium and tantalum. It has been found that oxidation of the conductors H1 etc. can be more closely controlled, as is highly desirable with the extremely thin tunneling layer 11, by employing a glow discharge environment to produce the oxide film thereon. That technique also allows faster oxide layer production. Desirably, the anodization is carried out in a glow discharge environment (plasma anodization) in a relatively oxygen-rich region, e.g. in the region nearest the cathode. For example, such anodization may be carried out in about 3 minutes under voltages of about 500 to 800 volts, with an oxygen partial pressure of about 10 to 50 microns. Preferably during the glow discharge anodization the atmosphere is kept water vapor free and substantially nitrogen free.

As has already been pointed out, when short-circuit points such as that shown in FIGURE 2 at H3–V4 are desired, or when open-circuit points such as that shown in FIGURE 2 at H3–V5 are desired, appropriate depositions may be made prior to the aforesaid in situ oxidation step. Thus vacuum metal deposition of, for example, gold, may be made through a mask onto, for example, conductor H3 to form thin film 12 at the portion of conductor H3 which will subsequently underlie conductor V4. Also, for example, a suitable insulating material, for example, silicon monoxide, may be deposited through a mask at, for example, a portion of conductor H3 which subsequently will underlie the conductor V5. By employing the appropriate mask in each case, selected short-circuit points similar to H3–V4, and selected open-circuit points similar to H3–V5, may be produced on the array of conductors H1 etc., V1 etc.

Subsequent to the deposition of any selected noble metal thin film areas 12 or selected insulating material thin film areas 13 or in situ oxidation operation the conductors V1 etc. will be deposited, preferably by vacuum deposition as aforesaid, upon the underlying structure so as to form a grid between the conductors H1 etc. and V1 etc. The positioning of the conductors V1 etc. is arranged so that each of the selected areas upon the conductors H1 etc., that has been prepared by the deposition of a layer 12 or a layer 13, is crossed by an overlying conductor V1 etc. to form a short-circuit point or an open-circuit point or capacitive point or other desired electrical thin film structure, respectively.

Where short-circuit points such as is shown in FIGURE 2 at H3–V3 are desired, the overlying conductor, for example V3, is deposited atop the thin film material layer 11, which in turn is atop the conductor, for example, electrode H3. A voltage is then applied between the respective conductors, for example, H3 and V3 and this voltage is raised until a break-down current is caused between the conductors which current causes the perforated areas or breaks 11*a* in film 11 which subsequently forms a short-circuit between the conductors as already described. It is sometimes desired to produce an overlayer upon the structure as shown in FIGURE 2, for purposes of insulation or physical protection and the like. Such an overlayer may constitute polyurethane or some other similar protective, insulating material applied by an appropriate technique.

Referring now to FIGURE 3, an alternative structure is there shown. As has already been explained, either the structure of FIGURE 2 or the structure of FIGURE 3 may be produced by any of the techniques taught herein. However, the variant of the process wherein the thin film intermediate layer, such as a thin film intermediate layer exhibiting tunneling or other electron transfer mechanism, is produced by in situ oxidation lends itself to production of the structure shown in FIGURE 2 with the various structures shown therein. On the other hand, the structure of FIGURE 3 lends itself to the variant of the process wherein the thin film intermediate layer is produced by deposition rather than by in situ oxidation.

The substrate 20 shown in FIGURE 3 comprises glass or alumina or a similar insulating material, and is in all respects the same as the substrate 10 shown in FIGURE 2. Similarly the conductors H3 etc. and V1 etc. shown in FIGURE 3 are in all respects the same as the conductors employed in the structure illustrated in FIGURE 2. The metal or metals from which the conductors of the structure shown in FIGURE 3 may be fabricated comprise all the metals recited previously with regard to the structure shown in FIGURE 2.

A principal difference in the structure shown in FIGURE 3 resides in the fact that since deposition of the thin film intermediate layer is contemplated, rather than in situ oxidation thereof, a mask may be employed to locate and position the intermediate layer, e.g. the diode forming crossing points, between the conductors H1 etc. and V1 etc. Moreover, the conductors may be any of the recited metals, without regard to whether or not those metals may be oxidized. The combination of these two facts results in the structure of FIGURE 3 being preferred in some instances for the variant of the process wherein deposition of the thin film intermediate layer, e.g. a layer of a material exhibiting tunneling or other electron transfer mechanism, is practiced.

On the other hand, the structure of FIGURE 2 is preferred with the variant of the process employing in situ oxidation, e.g. for the production of the aluminum oxide tunneling layer, because such oxidation cannot be done through a mask, that is to say, such oxidation must be performed upon all bare portions of the conductors H1 etc. By use of the term bare is meant portions of the conductors H1 etc. that do not have an overlayer of some other material. This unavailability of mask techniques with in situ oxidation, i.e. unavailability for all practical purposes, results in resort to the steps and structures already explained for forming the various elements at each crossing area between any conductors shown in FIGURE 2.

The structures which constitute these elements in the embodiment according to FIGURE 3, comprise, in the case of diodes as at H3–V1 and at H3–V2, a thin film layer 21 of a material selected to exhibit tunneling or other electron transfer mechanisms. Such materials will form a diode with the overlying and underlying metals or conductors as already stated. While many materials exhibit such tunneling or other desired electrical characteristics, a preferred material is selected from the class consisting of aluminum oxide and the oxide of said first conductors, i.e. conductors H1 etc. Metal oxides, other than the oxides of the first conductors, are also useful and cadmium sulfide is particularly useful since it possesses special, unique properties. These thin film layers 21 preferably cover, in this embodiment, only the portion of a conductor, e.g. electrode H3, which is subsequently overlaid by another conductor V1 etc. That is to say, only those crossing areas which are to constitute diode elements and the like include a thin film layer 21, and that thin film layer 21 does not preferably extend appreciably beyond each said crossing area. For example, the diodes produced at H3–V1 and H3–V2 in FIGURE 3 correspond to the diodes H3–V1 and H3–V2 shown in FIGURE 2.

The conductors V3 and V4 in FIGURE 3 are shown overlying the conductors H1 etc. e.g. electrode H3. Thus is produced in the embodiment of FIGURE 3 short-circuit points, such as for example at H3–V3 and H3–V4. These short-circuit points correspond to the similarly identified short-circuit points in the embodiment of FIGURE 2. However, of course, as a result of employment of the deposition technique for the application of thin film layers 21, no intermediate structure is involved at the example points H3–V3 and H3–V4 shown in the structure of FIGURE 3, unlike the similarly identified points in the structure of FIGURE 2.

The example open-circuit point H3–V5 shown in FIGURE 3, comprises the same structure shown in FIGURE 2. That is to say, the conductors H1 etc., for example, the conductor H3, bears an overlayer of an insulating material 23, for example silicon monoxide, covering the crossing point between the conductors defining the selected open-circuit point. The same structure is found at layer 13 at point H3–V5 in the structure of FIGURE 2.

In the production of the structure according to FIGURE 3 the substrate 20 is cleaned in the same manner as has already been described with reference to FIGURE 2. The thickness of all the structures described with reference to FIGURE 3 are entirely similar to the thicknesses already mentioned with respect to the structure of FIGURE 2. The conductors H1 etc. are deposited as already described with regard to FIGURE 2. A mask may be employed to deposit selected thin film layer areas 21 at positions along conductors H1 etc., e.g. along conductor H3, which positions will subsequently underlie conductors V1 etc., so as to form diodes at selected crossing between conductors H1 etc. and conductors V1 etc.

Another mask may then be employed to apply the silicon monoxide or other insulating material layer 23 to selected positions on the conductor H3, which points will subsequently underlie conductors V1 etc. to form open-circuits at selected crossings therebetween. In FIGURE 3, the example open-circuit results at H3–V5 from the deposition through a mask of insulating material layer 23 at a position on conductor H3 which is subsequently overlaid by conductor V5.

The short-circuit points H3–V3 and H3–V4 are inherently produced in the deposition variant of the process during the deposition of the conductors V1 etc. That is to say, any crossing area not including a layer 21 or layer 23 will instead present a metal surface of the electrode concerned, and consequently the deposition of the overlying conductors on such areas will result in bonding therebetween to form a short-circuit at each such selected area.

A wide variety of thin film structures having substantially any desired electrical characteristics, in array form, may be produced according to the invention. While at least one of the conductors making up H1 etc. and/or V1 etc. must be oxidizable with the in situ oxidized variation of the invention, and preferably constitutes aluminum or titanium or tantalum, the associated conductor can be any other metal even in that variation. Highly desirable combinations or thin film structures involving in situ oxidation include Al-$Al_2O_3$-Al, Al-$Al_2O_3$-Au, Ti-TiO-Ta and Ta-TaO-Au. These and many other combinations can also be produced by the deposition variation wherein the intermediate layer is deposited rather than in situ oxidized. Of special interest as deposited combinations are Au-CdS-Au, Au-CdS-In and Au-CdS-Al.

Thin film structures arrayed and produced in accordance with this invention include the non-symmetric diodes, the symmetric diodes and the so-called formable diodes.

The non-symmetric diodes in an array in accordance with this invention may be deposited in the following manner. The conductor, such as an H1, etc. conductor, may be of gold having thickness of approximately 1000 Angstrom units. A film of cadmium sulfide having a thickness of approximately 1000 Angstrom uuits is then deposited, followed by the deposition of another conductor, such as a V1, etc. conductor, made up of a suitable metal, such as aluminum having a thickness of about 1000 Angstrom units. The resulting diode will show the non-symmetrical characteristic normally associated with a diode device, i.e. exhibits a low forward impedance and a high backward impedance. Upon biasing the gold conductor positive and the aluminum conductor negative there will be produced an electron flow from aluminum to gold or a conventional current flow from the gold conductor to the aluminum conductor. By biasing the gold conductor negative and the aluminum conductor positive there will, however, be produced conventional current flow from the aluminum conductor to the gold conductor.

Further, in accordance with the practice of this invention the non-symmetrical diode may be deposited in reverse order, i.e. first the deposition of the aluminum conductor, followed by the deposition of the calcium sulfide insulating overlayer film, then followed by the deposition of the gold conductor. Biasing the resulting diode in the manner indicated hereinabove would produce the same currents but the current directions would be opposite due to the physical inversion of the respective conductors. Such a construction and an array combining such constructions would be useful where it is desirable to have two adjacent diodes in the array connected in a back-to-back relationship.

The use of symmetrical diodes, i.e. diodes having symmetrical characteristic curves, are becoming increasingly of interest in logical design, the design of three level logical devices and the like. Such devices and diodes may be fabricated in accordance with the practice of this invention using aluminum as the sandwiching conductors, such as conductors H1, etc. and V1, etc. having a thickness of about 1000 Angstrom units and employing an intermediate aluminum oxide insulating film having a thickness of approximately 20 Angstrom units. The polarity of the signals applied to the respective sandwiching conductors will determine the direction of conduction.

So-called formable diodes might also be included in the array of devices prepared in accordance with this invention. Such formable diodes could be employed as protective devices. For example, a formable diode constructed of lead conductors sandwiching an aluminum layer having a thickness in the range of about 300 Angstrom units might be prepared. This device would act for all purposes as an open circuit until a voltage of sufficient magnitude and of sufficient duration is impressed across the conductors to cause forming of the aluminum oxide intermediate layer at which time the device would act as a tunneling diode. Such a device could be incorporated in an array produced in accordance with this invention to act as a protective device to monitor voltages within the array or the system and to prevent abnormal voltage levels from destroying the remaining circuits or components.

The practice of this invention is also applicable to the production of an array of electronic components including single crystal diodes. The practice of this embodiment results in the production of an array in a form more like an open face sandwich in that all conductors and all operating steps are performed from one side of the substrate.

The technique of this embodiment of the invention is as follows: A single crystal of a silicon semi-conductor material of the degenerate type, i.e. doped with boron to make it P type, is employed as a basic building block. By use of a mask having apertures at the points where the diodes are to be formed, N type material, such as arsenic, may be diffused to form a plurality of discrete N type areas in the P substrate. The entire surface of the substrate is now oxidized. A second mask is placed over the substrate with apertures corresponding in position to the apertures of the first mask previously employed for the deposition or diffusion of the N type material, but smaller in size. By means of this second mask the surface of the substrate is etched to expose only a portion of each of the diffused N type areas. Into each of these now exposed areas a P type material, such as boron, is diffused. The surface is again oxidized. A further masking and etching procedure follows wherein a smaller portion of the P type area last diffused and a portion of the N type area first diffused are exposed. Metal leads are connected to these points, such as by filling with aluminum. The horizontal and vertical conductors may now be deposited so as to connect the various diodes and standard insulating techniques and the techniques in accordance with this invention for depositing insulating layers may be used to prevent shorting at the crossover points of the conductors.

Thin film structures fabricated in accordance with the invention are useful for forming a variety of circuits, depending upon intended use. An advantageous use is as a computer logic matrix, as already explained. In any use, other elements, active or passive, may be included within the array, at its side or edge, or may be connected thereto. Thus for example, an array can be arranged with an appropriate number of H and V conductors, and appropriately selected diodes, to constitute a flip-flop logic circuit with multiple path inputs, the resistors and amplifiers being arranged at the edge of the array, and the matrix of diodes constituting the interconnections. The characteristics of diodes produced according to the invention is such that employment with bipolar and insulated-gate transistors may be had, including employment with deposited cadmium sulfide insulated gate transistors. When such deposited transistors and deposited resistors are employed, appropriate interconnecting diode matrices can be designed and produced according to the invention to create entire circuits, e.g. computer logic circuits, entirely by deposition techniques. In this, as in other applications, the saving in space and cost made possible by the invention is evident.

The invention has been described with reference to illustrative embodiments. Variations are possible, and the appended claims define the true scope of the invention.

The embodiments of the invention in which an exclusive property or privilege is claimed are defined as follows:

1. A thin film structure comprising:

(a) an insulating substrate;

(b) a plurality of first discrete thin film metallic conductor elements deposited on said substrate;

(c) a plurality of second discrete thin film metallic conductor elements overlying said first conductor elements so as to define a plurality of crossing locations therebetween;

(d) a non-metallic thin film material exhibiting tunneling or other electron transfer mechanism characteristics interposed between said first and second conductor elements at a first portion of said crossings;

(e) insulating material interposed between said first and second conductor elements at each of a second portion of said crossings; and (f) wherein some of said first discrete thin film metallic conductor elements are short circuit connected to some of said second discrete thin film metallic conductor elements at a third portion of said crossings.

2. A thin film structure comprising:

(a) an insulating substrate;

(b) a plurality of first discrete thin film metallic conductor elements deposited on said substrate;

(c) a plurality of second discrete thin film metallic conductor elements overlying said first conductor elements so as to define a plurality of crossing locations therebetween;

(d) a thin film material element interposed between one of said first and second conductor elements at each of a first portion of said crossings, said thin film material being selected from the class consisting of:

(i) aluminum oxide, (ii) oxide of said first conductor, and (iii) cadmium sulfide;

(e) means defining a direct electrical connection between one of said first and second conductor elements at each of a second portion of said crossings; and (f) a thin film insulating material interposed between and bonded to one of said first and second conductor elements at each of a third portion of said crossings providing an open circuit between each of said first and second conductor elements.

3. A thin film structure according to claim 2 wherein said means comprises a thin film element of a noble metal.

4. A thin film structure comprising:

(a) an insulating substrate;

(b) a plurality of essentially parallel and equally spaced first discrete thin film aluminum conductor elements bonded to said substrate;

(c) a plurality of essentially parallel and equally spaced second discrete thin film aluminum conductor elements overlying said first conductor elements so as to form a grid therewith having a plurality of crossing locations;

(d) a thin film aluminum oxide element of about 10 to 30 Angstrom units thickness interposed between one of said first and second conductor elements at each of a first portion of said crossings;

(e) insulating material interposed between and bonded to one of said first and second conductor elements at each of a second portion of the remainder of said crossings; and (f) wherein said thin film aluminum oxide element at some of said crossings is perforated to provide a direct connection between some of said first and second conductor elements.

References Cited

UNITED STATES PATENTS

| | | | |
|---|---|---|---|
| 3,106,648 | 10/1963 | McMahon | 307—88.5 |
| 3,149,299 | 9/1964 | McMahon | 338—32 |
| 3,256,588 | 6/1966 | Sikina | 317—234 |

JOHN W. HUCKERT, *Primary Examiner.*

M. EDLOW, *Assistant Examiner.*

U.S. Cl. X.R.

307—322; 317—235; 340—173, 174